US007298161B2

(12) United States Patent
Bernstein et al.

(10) Patent No.: US 7,298,161 B2
(45) Date of Patent: Nov. 20, 2007

(54) CIRCUITRY AND METHODOLOGY TO ESTABLISH CORRELATION BETWEEN GATE DIELECTRIC TEST SITE RELIABILITY AND PRODUCT GATE RELIABILITY

(75) Inventors: Kerry Bernstein, Underhill, VT (US); Ronald J. Bolam, Fairfield, VT (US); Edward J. Nowak, Essex Junction, VT (US); Alvin W. Strong, Essex Junction, VT (US); Jody J. Van Horn, Underhill, VT (US); Ernest Y. Wu, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/088,953

(22) Filed: Mar. 24, 2005

(65) Prior Publication Data
US 2005/0184720 A1    Aug. 25, 2005

Related U.S. Application Data

(62) Division of application No. 10/248,506, filed on Jan. 24, 2003, now Pat. No. 6,891,359.

(51) Int. Cl.
  *G01R 31/26* (2006.01)
(52) U.S. Cl. ...................... 324/769; 324/765
(58) Field of Classification Search ................ 324/760, 324/765, 769, 158.1; 714/1; 716/4; 702/108
See application file for complete search history.

(56) References Cited

U.S. PATENT DOCUMENTS 3,796,955 A    3/1974  Bhattacharyya et al.
5,619,462 A    4/1997  McClure (Continued)

OTHER PUBLICATIONS

Electrical Breakdowns and Breakdown Mechanism in Ultrathin Silicon Oxides, J.C. Jackson, et al., Microelectronics Reliability 39 (1999) pp. 171-179.

(Continued)

*Primary Examiner*—Vinh Nguyen
*Assistant Examiner*—Roberto Velez
(74) *Attorney, Agent, or Firm*—Scully, Scott, Murphy & Presser, P.C.; William D. Sabo, Esq.

(57) ABSTRACT

A method and system for predicting gate reliability. The method comprises the steps of stressing a gate dielectric test site to obtain gate dielectric test site data and using the test site data to predict gate reliability. Preferably, the test structure and the product structure are integrated in such a manner that a test site occupies some of the product area and the product itself occupies the remainder of the product area. A preferred methodology, more specifically, is as follows: (1) Test structures at start both in parallel stress mode and in ring oscillator or "product" mode; (2) Analyze the breakdown data as per the present state of the art for each of the areas based on the parallel stress mode; (3) Combine the above breakdown distributions using the area scaling to improve the confidence bounds of the Weibull slope of the cumulative distribution function; (4) Test the ring oscillators in the product mode to determine how many of the stress fails are also product fails as defined by an operational degradation; (5) Subdivide the failures to determine the relationship between the first fail, and the second fail, and the nth fail; (6) Investigate which stress fail, if not the first stress fail, is more likely to cause a product fail as defined by operational degradation; and (7) Based on the subdivision in step 5 and the results in step 6, make projection based on that fail which is most likely to cause fail. The methodology as outlined above bridges between dielectric stress fails and product degradation both in the case of each stress fail causing a product degradation, as well as in the case where more than one stress fail occurs before any product degradation occurs. And this relationship can be quantified.

7 Claims, 12 Drawing Sheets

U.S. PATENT DOCUMENTS

| | | |
|---|---|---|
| 5,625,288 A | 4/1997 | Snyder et al. |
| 5,898,706 A | 4/1999 | Defresne et al. |
| 5,900,644 A | 5/1999 | Ying et al. |
| 6,049,213 A * | 4/2000 | Abadeer ............ 324/719 |
| 6,060,791 A | 5/2000 | Goerz et al. |
| 6,133,746 A * | 10/2000 | Fang et al. ............ 324/769 |
| 6,181,154 B1 | 1/2001 | Beffa |
| 6,628,134 B1 * | 9/2003 | Lee ............ 324/763 |
| 6,657,241 B1 | 12/2003 | Rouse et al. |
| 6,724,214 B2 * | 4/2004 | Manna et al. ............ 324/766 |

OTHER PUBLICATIONS

Defensive Publication T944, 007, Testing Systems and Processes for Manufacturing Complex Articles, R.M. Booth, Jr., et al. Mar. 2, 1976.

Gate Quality Tests at Polysilicon Etch Step on CMOS Products, IBM Technical Disclosure Bulletin, vol. 32, No. 3B, Aug. 1989.

* cited by examiner

Test Chip 3 with areas of
.0001, .001, and .01mm²

Test Chip 3
with Area and Voltage Scaling

CIRCUITRY AND METHODOLOGY TO ESTABLISH CORRELATION BETWEEN GATE DIELECTRIC TEST SITE RELIABILITY AND PRODUCT GATE RELIABILITY

This application is a divisional of U.S. application Ser. No. 10/248,506, now U.S. Pat. No. 6,891,359, filed Jan. 24, 2003.

BACKGROUND OF THE INVENTION

1. Technical Field

This invention generally relates to the field of reliability testing of integrated circuits. More specifically, the invention relates to a methodology to establish a correlation between gate dielectric test site reliability and product gate reliability.

2. Related Art

In the reliability engineering of integrated circuits, it is necessary to predict product lifetimes and to calculate defect densities. To accomplish this in a short time, product samples may be subjected to environmental conditions that accelerate the failure modes that cause wearout. Typical methods for creating these stress conditions include the use of temperatures and voltages that exceed the operating temperatures and voltages when the circuit is in actual use.

As semiconductor dimensions continue to shrink, the gate dielectric thickness continues to decrease and the voltage is scaled down. The voltage scaling is at a lower rate than is the gate thickness decrease so that the field across the gate is increasing (V/tox). As the oxides continue to decrease, accurate prediction of the oxide reliability becomes more critical. However, also as the oxide continues to decrease, the correlation to the produce reliability seems to become more elusive.

SUMMARY OF THE INVENTION

An object of this invention is to provide an improved method and system to establish the correlation between gate dielectric test site reliability and product gate reliability.

Another object of the present invention is to provide a procedure that will yield a quantitative relationship between test site dielectric results and product reliability results.

A further object of the invention is to eliminate dielectric reliability as an artificial barrier to thinner oxides and more aggressive semiconductor designs.

These and other objectives are attained with a method and system for predicting gate reliability. The method comprises the steps of stressing a gate dielectric test site to obtain gate dielectric test site data and using the test site data to predict gate reliability. Preferably, the test structure and the product structure are integrated in such a manner that a test site occupies some of the product area and the product itself occupies the remainder of the product area.

A preferred methodology, more specifically, is as follows:

1. Test structures at start, both in parallel stress mode and in ring oscillator or "product" mode.

2. Analyze the breakdown data as per the present state of the art for each of the areas based on the parallel stress mode.

3. Combine the above breakdown distributions using the area scaling to improve the confidence bounds of the Weibull slope of the cumulative distribution function.

4. Test the ring oscillators in the product mode to determine how many of the stress fails are also product fails as defined by an operational degradation.

5. Subdivide the failures to determine the relationship between the first fail, the second fail, and the nth fail.

6. Investigate which stress fail, if not the first stress fail, is more likely to cause a product fail as defined by operational degradation.

7. Based on the subdivision in step five and the results in step six, make projection based on that fail which is most likely to cause fail.

The methodology as outlined above bridges between dielectric stress fails and product degradation both in the case of each stress fail causing a product degradation, as well as in the case where more than one stress fail occurs before any product degradation occurs. And this relationship can be quantified.

Further benefits and advantages of the invention will become apparent from a consideration of the following detailed description, given with reference to the accompanying drawings, which specify and show preferred embodiments of the invention.

DETAILED DESCRIPTION

The present invention provides a methodology for testing an integrated circuit having a test structure integrated with a product structure itself. The test structure and the product structure are integrated in such a manner that a test site occupies some of the product area and the product itself occupies the remainder of the product area.

This integrated structure maintains an advantage of a localized test structure and has a further advantage of directly duplicating a tool loading for the etch and deposition steps during a manufacture of the integrated circuit. As wafer diameters increase, it becomes more important to duplicate this tool loading factor as closely as possible to ensure that the depositions and etches during the manufacturing process of the integrated circuit behave the same way on the product as they do on the test structure. It is very important that the processing steps be designed for the product and not for the test site since the integrated circuit is for actual use as a product.

Generally, to implement the present invention, a semiconductor wafer is provided with a test site having a test structure and that structure is stressed to cause failures. The results of the stress tests are then analyzed to predict the reliability of the whole semiconductor device.

Figure 1:
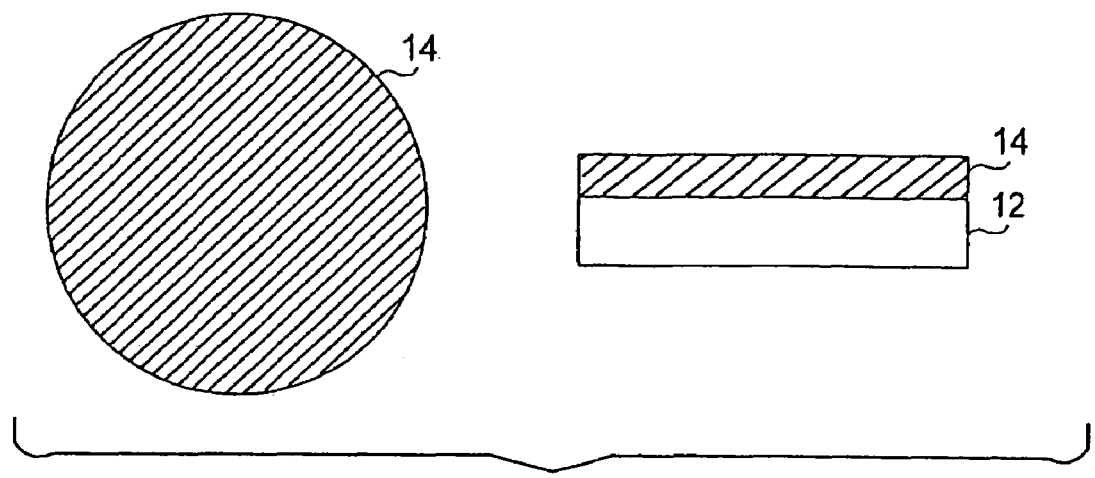
FIGS. 1 and 2 generally illustrate a semiconductor device having a test site.
Figure 2:
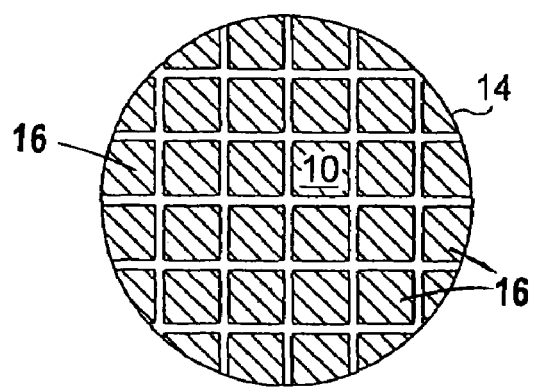

FIG. 1 shows, as a representative example, a semiconductor wafer 10 that may be used in the practice of the invention. Wafer 10 includes a substrate 12 whereon a layer of gate oxide 14 has been formed. It will be appreciated that FIG. 1 is not to scale. For example, gate oxide 14 may be as thin as 10 A, and substrate 12 may be 100 um or thicker. As represented in FIG. 2, during normal wafer fabrication, the semiconductor 10 is patterned and etched to define a plurality of individual gates 16. While FIG. 2 depicts approximately two dozen gates, it is understood that wafer 10 can actually contain several hundred million (or more) individually defined gates. Each gate, it may be noted, is associated with an underlying metal-oxide semiconductor or MOS transistor device.

Figure 3A:
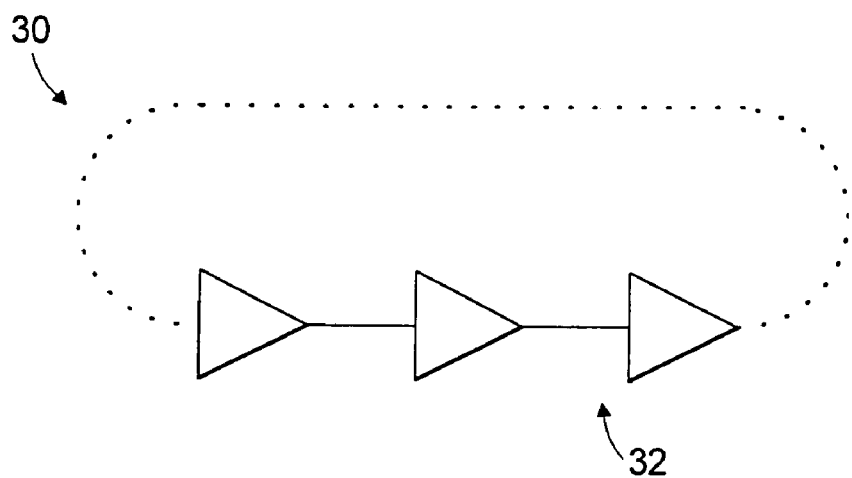
FIG. 3A generally illustrates a test site structure that may be used in the practice of this invention.
Figure 3B:
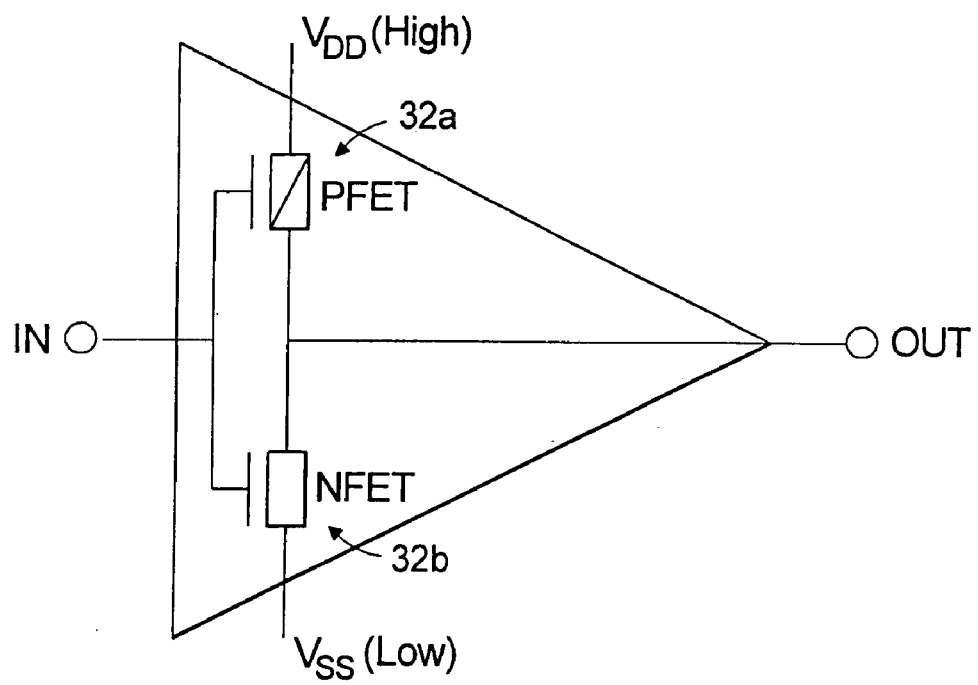
FIG. 3B shows one inverter of the test structure of FIG. 3A.

Any suitable test structure may be used in this invention. Preferably, for example, as represented in FIG. 3A, the test structure may be a ring oscillator 30 having a minimum of 1001 pairs of gates 32 (where a pair of gates is one inverter comprised of Pfet 32a and Nfet 32b as shown in FIG. 3B) and for which the gates have a stress mode with which they can all be wired in parallel so that all of the gates of the structure may be stressed at the same time. Other structures may also be used.

For instance, a second structure could be used that is identical to the above-described first structure but having a minimum of 8009 pairs of gates, and for which each set of 1001 pairs of gates are electrically identifiable.

A third structure that could be used is identical to the first structure but has a minimum of 50051 pairs of gates, and for which each set of 1001 pairs of gates are electrically identifiable.

Also, a fourth structure could be used that is identical to the first structure but has a minimum of 100101 pairs of gates, and for which each set of 1001 pairs of gates are electrically identifiable. This fourth structure may be preferred but is not necessary.

Figure 4:
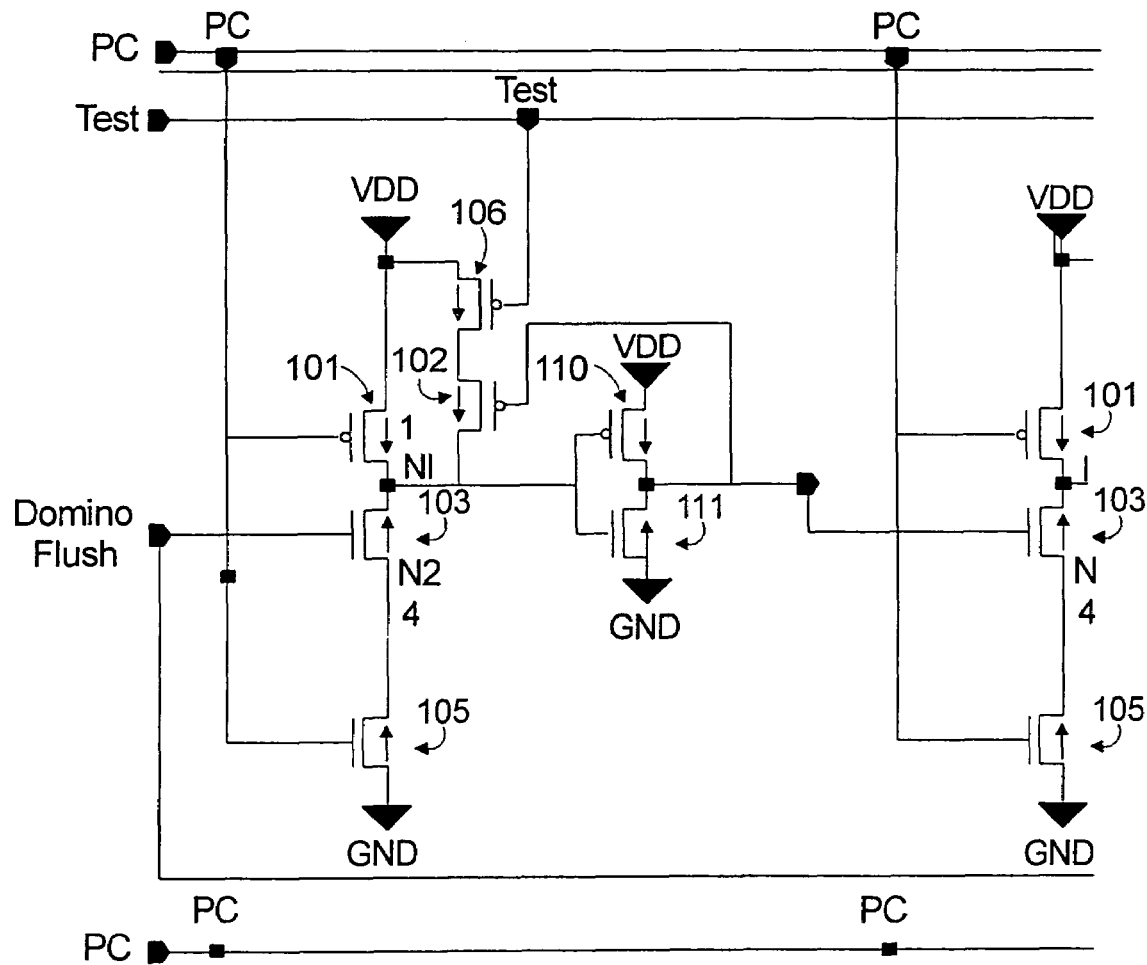
FIG. 4 illustrates an alternate test structure.

FIG. 4 shows, as another example, another structure, referred to as Dynamic Oxide Test Structure (DOTS), that may also be used as a test structure. This structure is very sensitive to the erosion in potential across the precharge capacitance of its summand node and thus is a well suited candidate for a gate oxide stress test vehicle. Table 1 below provides specific device characteristics.

TABLE 1

| Device | Type | Oxide | Beta | Width (waf) | Length (waf) | Width (MDR) | Length (MDR) | Par | Keeper |
|---|---|---|---|---|---|---|---|---|---|
| 101 | PFET | Thick | 3.15 | 0.3125 | 0.0992 | 1.18 | 0.55 | 1 | |
| 102 | PFET | Thick | 0.25 | 0.115425 | 0.4617 | 1.02 | 2.00 | 1 | 5.00% |
| | | | 0.5 | 0.23085 | 0.4617 | 1.48 | 2.00 | 1 | 10.00% |
| | | | 1 | 0.4617 | 0.4617 | 2.40 | 2.00 | 1 | 20.00% |
| | | | 2 | 0.9234 | 0.4617 | 4.25 | 2.00 | 1 | 40.00% |
| 103 | NFET | Thick | 10 | 0.625 | 0.0625 | 2.94 | 0.55 | 2 | |
| 105 | NFET | Thick | 15 | 0.9375 | 0.0625 | 4.19 | 0.55 | 3 | |
| 106 | | Thick | 93.1 | 9.234 | 0.0992 | 37.49 | 0.55 | 8 | AlphaRatio |
| 110 | PFET | Thin | 14.4 | 1.25 | 0.0867 | 5.56 | 0.50 | 2 | 2 |
| | | | 36 | 3.125 | 0.0867 | 13.06 | 0.50 | 5 | 5 |
| | | | 72.1 | 6.25 | 0.0867 | 25.56 | 0.50 | 10 | 10 |
| | PFET | Thin | 12.6 | 1.25 | 0.0992 | 5.56 | 0.55 | 2 | 2 |
| | | | 31.5 | 3.125 | 0.0992 | 13.06 | 0.55 | 5 | 5 |
| | | | 63 | 6.25 | 0.0992 | 25.56 | 0.55 | 10 | 10 |
| 111 | NFET | Thin | 5 | 0.25 | 0.05 | 1.44 | 0.50 | 1 | |
| | | | 4 | 0.25 | 0.0625 | 1.44 | 0.55 | 1 | |

** NOTE:
1) The graduated sizings of devices 110 and 111 remain coupled for width and length. (i.e. 3 widths × 2 lengths = 6 possible combinations only)
2) 6 combinations above are repeated for 4 strengths of keeper device 102
3) Yields 24 unique chains.
4) PAR (AS/X) is the number of parallel fingers which together produce the shown width External pad connection assignments are as follows:

| VDD | 1 (Common) |
|---|---|
| GND | 1 (Common) |
| PC CLOCK | 1 (Common) |
| TEST | 1 (Common) |
| DOMINO INPUT | 1 (Common) |
| DOMINO OUTPUT | 24 |

Options discussed for muxing 24 outputs to single counter output.

Devices 101, 102, 103, 105 and 106 are thick oxide devices with a channel length one grid step greater than minimum, so that neither direct tunneling, subthreshold, nor gate oxide defect currents associated with the evaluate or precharge will complicate the output. Device 106 is added to the keeper path to disable charge replacement current if defects need to be evaluated. Devices 110 and 111 comprise the evaluating buffer. Chains of these circuits are constructed as shown at 120 in FIG. 5. The chains are made as long as possible, perhaps, 10,000 cell. The length is limited only by the available test site area. High defect currents could sink varying amounts of current, so device 102's beta (W/L) is incrementally increased on subsequent chains to contain the possible process scenarios. Device 106, on the other hand, is held very wide so that the resistance it presents to the path remains inconsequential. This suite of chains, is repeated to capture gate defect dependence on effects related to:

Keeper replacement current strength

Width dependence on devices 110 and 111 length dependence on devices 110 and 111

Figure 5:
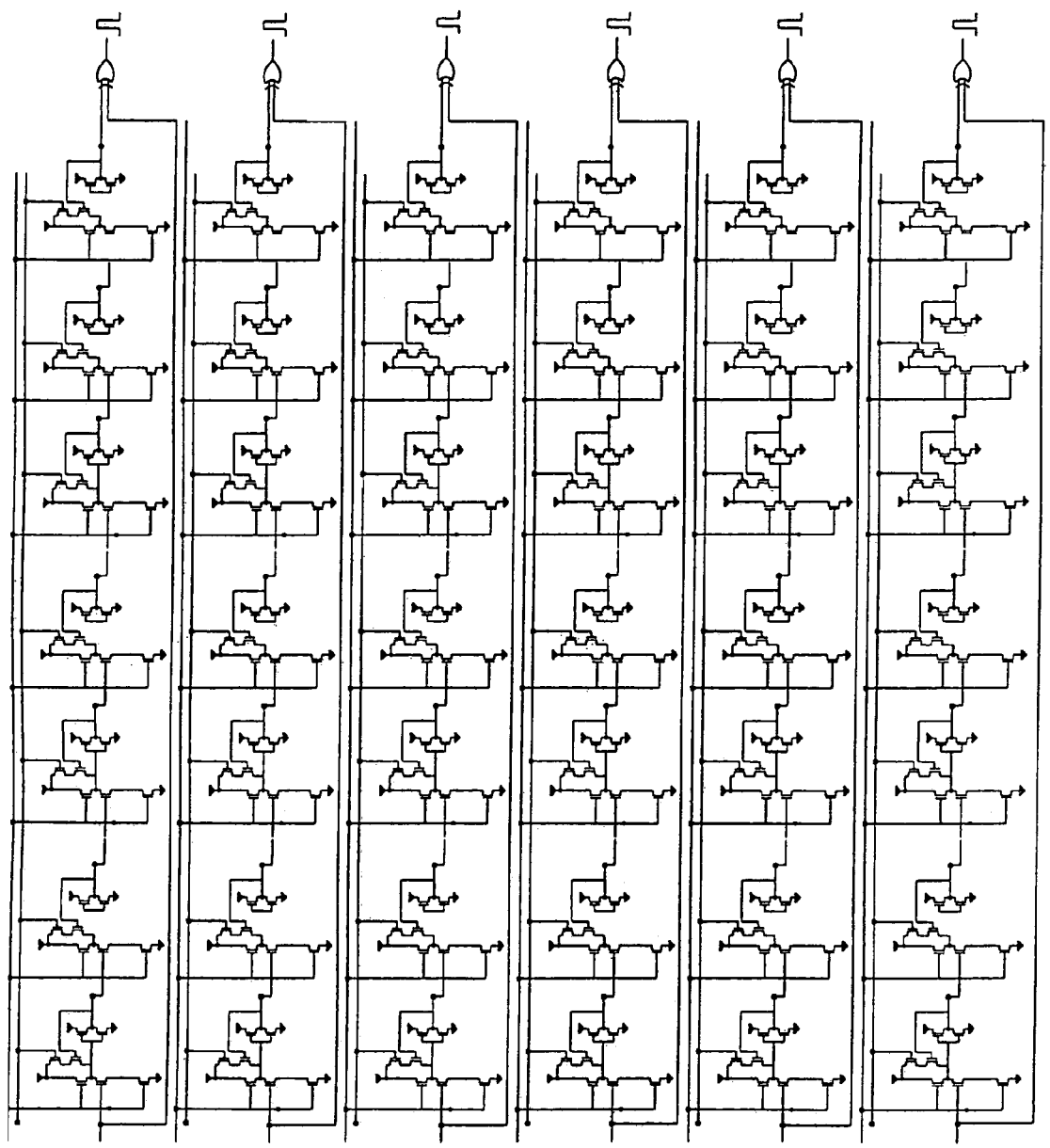
FIG. 5 shows a chain formed using the test structure of FIG. 4.

FIG. 5 shows an array of chained domino test structures.

The chains are configured with flexibility in mind, so that they can be operated in a number of different modes. Below are three example test modes/procedures.

Domino Flush Mode Test.

Domino Flush mode, the chain is precharged into the evaluate case. Data is coupled to the first domino in the chain, and simultaneously to an exor at the end of the chain. The chain has an even number of elements, such that the exor of the input and the output will create a pulse output, with width equal to the delay of the domino flush through the chain. This test will be useful to evaluate the impacts of stress or defects on performance.

Data Hold Mode Test

In Gate Leakage test mode, the domino is cycled through its precharge interval, but then left in its evaluate mode with input Domino Flush remaining low and Test input held high. Because the design of the structure isolates current passing through the gate dielectric, the delay from PC going high to chain output going high will increase monotonically with decreasing gate oxide leakage. Testing of multiple samples will establish a delay distribution: defects will be characterized by the delays of given chains not conforming to this established distribution.

Magnitude Assessment Testing

Upon Isolating fails from the above test, it is possible to toggle on and off transistor 106, such that the keeper current is or is not provided as replacement current to the given node. One then notes whether turning on the keeper resolves the fail (to a given fail criteria). Because chains with varying keeper strengths will be built in the test site, some keepers will contribute an insufficient amount of current, and the fail will persist. Over an extended period accumulating fails over many parts, it will be possible to establish the distribution in defect currents appearing on product.

The test structure is stressed to cause failures, and in particular, two types of failures. A first type of failure, referred to as a soft fail, occurs when one of the gates of the test structure begins to leak current. When this type of failure occurs, the structure, as a whole, is able to continue to function. A second type of failure, referred to as a hard failure, results in the test structure ceasing to operate.

The preferred methodology, in general, is as follows.

1. Test structures at start, both in parallel stress mode and in ring oscillator or "product" mode.

2. Analyze the breakdown data as per the present state of the art for each of the areas based on the parallel stress mode.

3. Combine the above breakdown distributions using the area scaling to improve the confidence bounds of the Weibull slope of the cumulative distribution function.

4. Test the ring oscillators in the "product" mode to determine how many of the stress fails are also product fails as defined by an operational degradation.

5. Subdivide the failures, for example into groups of 1001 pairs, to determine the relationship between the first fail, the second fail, and the nth fail.

6. Investigate which stress fail, if not the first stress fail, is more likely to cause a product fail as defined by operational degradation.

7. Based on the subdivision in step five and the results in step six, make projection based on that fail which is most likely to cause fail.

The methodology as outlined above bridges between dielectric stress fails and product degradation both in the case of each stress fail causing a product degradation, as well as in the case where more than one stress fail occurs before any product degradation occurs, for a ring oscillator whose device sizes are the same. And this relationship can be quantified.

Each of the above-identified steps is discussed below in detail.

1. Test structures (the arrays or stages of gates either inverter pairs, dynamic logic chain structures (DOTS), or other similar structures) at time zero both in a product mode configuration and a parallel mode configuration. The product mode configuration means that each stage is driven by the previous stage so that the voltage applied at a given stage is applied by that previous stage. In this configuration, one hard fail in any stage will cause the product to cease functioning. In the case of the ring oscillator, this means that it quits oscillating. A soft fail in any stage would cause a higher than normal leakage. The parallel mode configuration means that the gates to be stressed, all have the voltage applied to them directly from the external source instead of from the previous stage. A hard or soft fail at any stage will only cause a higher than normal leakage in this test configuration. But a hard fail should cause enough of an increase in current so that the test equipment can detect the time the hard breakdown occurred.

Step 2 can be divided into two substeps.

2a. Stress the structures according to the current state of the art in the parallel mode i.e., all of the gates, of the structure to be stressed, are connected in parallel in such a way that the stress voltage is applied simultaneously to all of them from an external source. Each structure is stressed until it fails—which means that one gate in that structure experienced a hard breakdown. The structures with larger numbers of gates, or stages, would be expected to breakdown earlier than those having a small number of gates for a given set of stress conditions. Typically three different voltages are used and, for each voltage, a sample of 40-200 structures is necessary to have a reasonably statistically significant result.

Often the temperature dependence is also of concern and in this case at least two different temperature conditions are used. The different temperature conditions may be done at the same voltage in the parallel stress mode as above.

2b. Analyze the breakdown data as per the current state of the art.

The structures during and at the end of each stress in the parallel configuration and for all conditions obtain the data as outlined below.

An example of this analysis is shown in FIGS. 6-12—it is only an example since the data on one of the charts is not all from the same hardware as the other data. the stress is conducted as per step 2a. In the case illustrated in FIG. 6, three voltage conditions have been run, each with about 50 structures. The time to fail is plotted on a log-of-time scale against a vertical axis that is in terms of a Weibull scale. The first fail is plotted approximately at the 1/50 position on the vertical scale, the second at 2/50, etc., with the last fail approximately at 50/50 or approximately at 100%. This is called a cumulative fail distribution since the point plotted is the total percent fallout of the population, at that time. The reason that the early and later positions are not exactly at 1/50, 2/50, . . . and . . . 49/50, 50/50 respectively, even for a sample size of exactly 50, is that the well-known methodology of plotting positions is used. This methodology is always used for small samples to better represent the true coordinate locations of the fails, and results in an offset for both the earlier fails and the later fails. The smaller the sample size the greater the offset.

Figure 6:
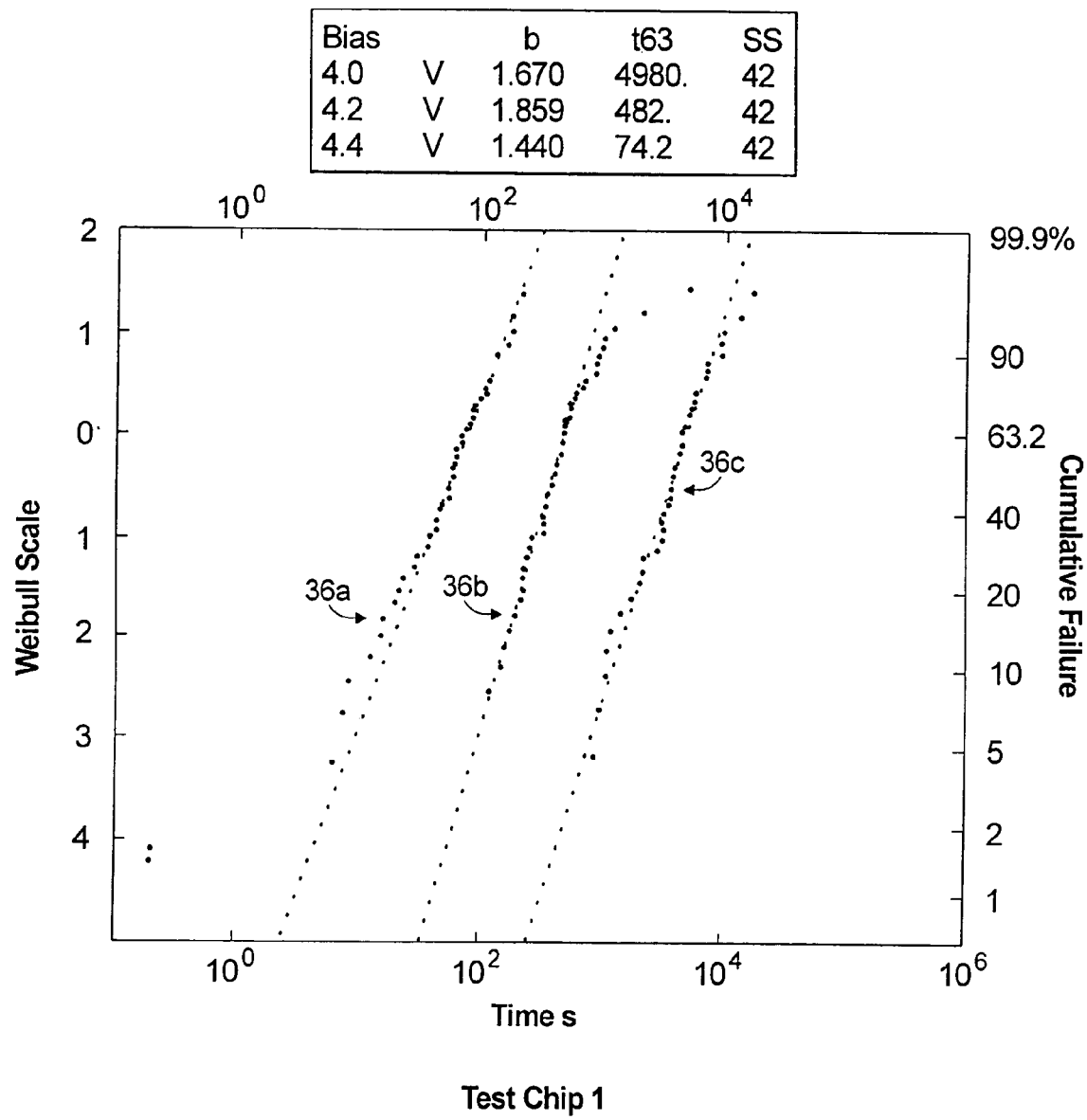
FIG. 6 is a graph showing test site stress fails for three voltage conditions.

The vertical axis is a measure of the cumulative fail and is defined as $\ln[-\ln(1-f)]$ for the Weibull distribution. A more readable percent fail scale is shown on the right hand side of FIG. 6 If the Weibull slopes (Beta) of the three curves are relatively similar, then the voltage acceleration may be modeled. In the chart of FIG. 6, the structures all had the same area and were all stressed at the same temperature so that voltage is the only variable. The curve 36a represents the −4.4V stress condition and since this is the highest voltage it has the shortest time to fail with a Weibull scale parameter or characteristic life time of 74.26 sec. The middle curve 36b is the data from the −4.2V stress, and the curve 36c with the longest time (4984 sec) is the curve for the −4V stress. These curves are plotted as shown, and the time (t1 & t2) for each voltage (V1 & V2) calculated and put into an acceleration formula. One common formula is shown below as Eq 1:

$$Voltacc = t1/t2 = \exp(\gamma(V1-V2))$$  Eq. 1.

where the absolute values of voltage (V) are used, and $\gamma$ is a constant.

This can then be solved for $\gamma$ as:

$$\gamma = [\ln(t1/t2)]/[V1-V2];$$

or for this example, $$\gamma = 4/0.4 = 10.$$

Now, with $\gamma$ known, the time acceleration from the stress voltage of 4V to a use voltage of, for example 2V, can be calculated:

$$Voltacc = \exp(10\,(4-2)) = \exp(20) = 4.8 \times 10^8\ T.$$

In addition, the three voltage curves can be collapsed into one to effectively increase the sample size and thus improve the statistical confidence of the results by applying this voltage acceleration between these curves.

Equation 1 is the equation that has been used historically for thicker oxides and is used in the example for simplicity; however, for ultrathin oxides, Equation 2, below, provides a better model for the voltage acceleration. The treatment is similar to above for the determination of n. Also, some analyses are best done using a combination of both acceleration models.

$$Voltacc = t1/t2 = (V2/V1)n$$  Eq. 2.

Figure 7:
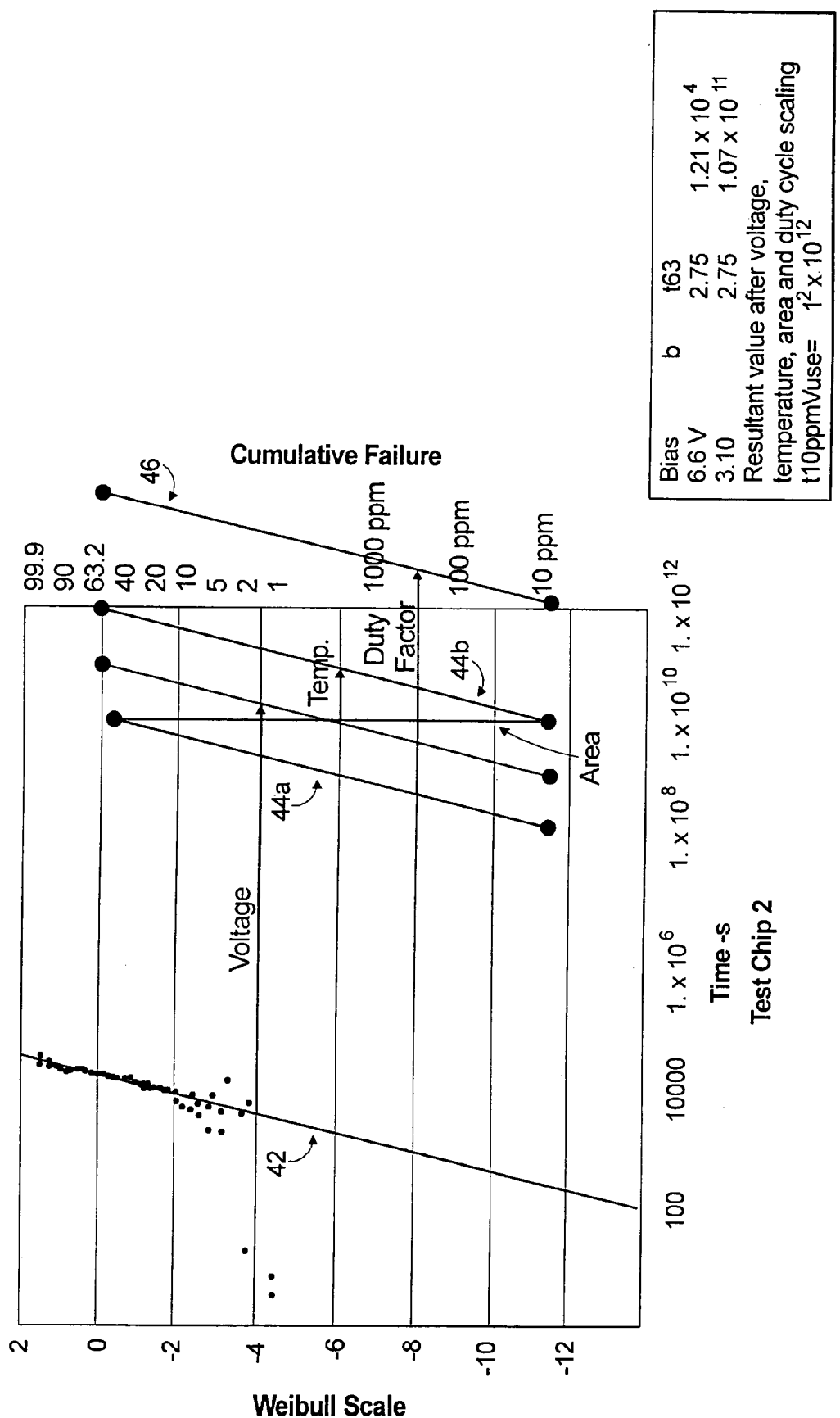
FIG. 7 is a graph illustrating a procedure for combining the three test results shown in FIG. 6.
Figure 8:
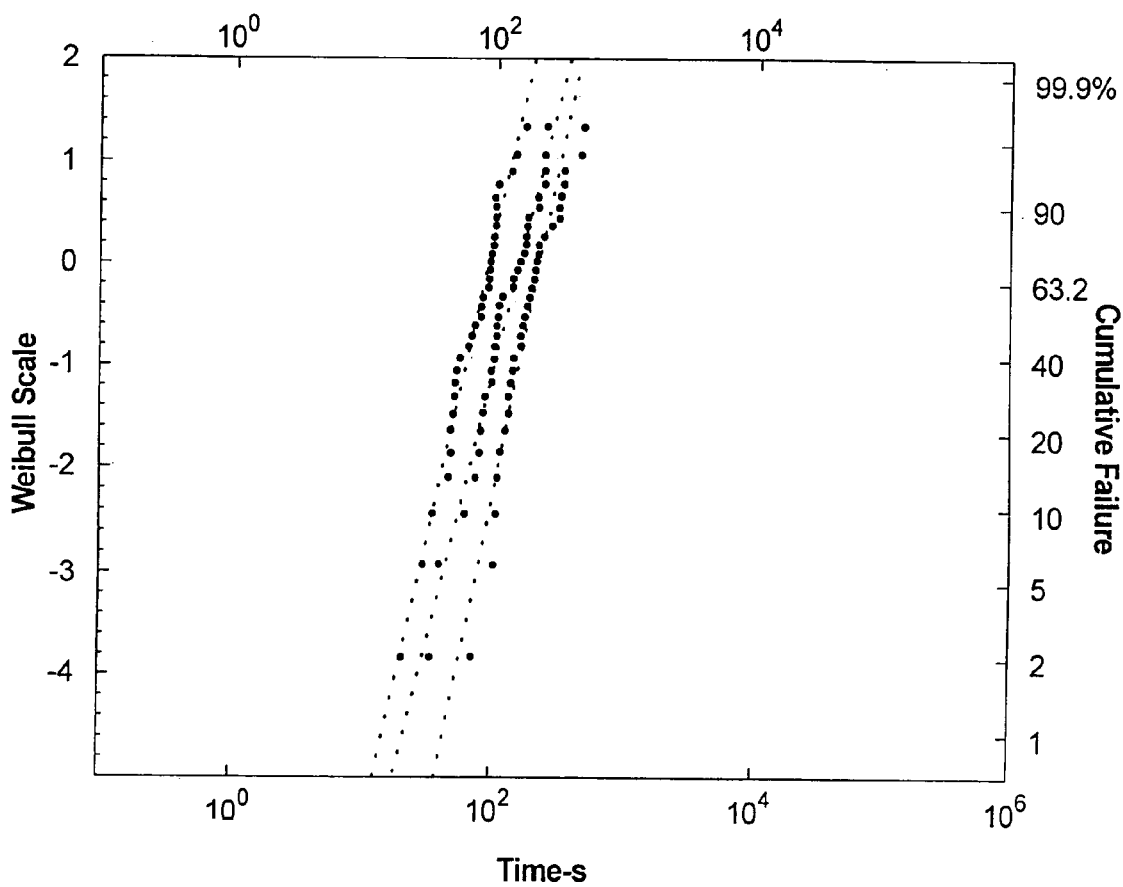
FIG. 8 is another graph showing the combined results of three tests.

The result of both voltage acceleration and temperature acceleration are shown in FIG. 7 for a different set of data at 42. The three voltage conditions have first been projected to a single set of data, and then the projection made for the voltage acceleration as per Eq 1 and for the temperature acceleration as per Eq 2 below. The thin curve 44a is the result after the voltage acceleration and the curve 44b is the result after the voltage and temperature acceleration.

$$Tempacc = t1/t2 = \exp[(a/T1)+(b/T2)]/\exp[(a/T2)+(b/T1)]$$  Eq 3.

where a and b are constants. For thicker oxides, this reduces to $$Tempacc = t1/t2 = \exp[H/k(T2-T1)]$$

where k is Boltzman's constant, T is in Celsius, and $\Delta H$ is a constant

Two additional steps are drawn in FIG. 7. The next step is the area projection. Here the projection is done according to the Poisson equation as given in Eq 4.

$$F1 = 1-[1-F2]\,A1/A2$$  Eq 4.

where F1 is the cdf (cumulative percent fail) of the product chip, F2 is the cdf of the test chip, and A1 and A2 are their respective areas. In the example of FIG. 7, the results from the 6K trench test site are to be projected to a 512M product chip, which actually has 536.87M trenches on the chip. Thus, from 10 ppm, F1=1−(0.99999) 89478=59% cum fail projected for the 512M product after voltage and temperature acceleration. It may be noted that this is the only factor that operates on the cumulative percent fail axis, the others operate on the time axis.

The final step shown in FIG. 7 is duty cycle. If the product chip only undergoes a stress during part of each cycle, only that part of the cycle needs to be considered. For example, if the duty factor is 0.01%, then the product result would be multiplied by 10,000, as shown at 46. It is important to observe that a shallow Weibull slope, impacts every curve in FIG. 7, and given the starting point is at 63.2% for the projection and the extrapolation is to 1-10 ppm, a line with a shallow slope will predict much worse reliability than one with a steep slope.

Figure 9:
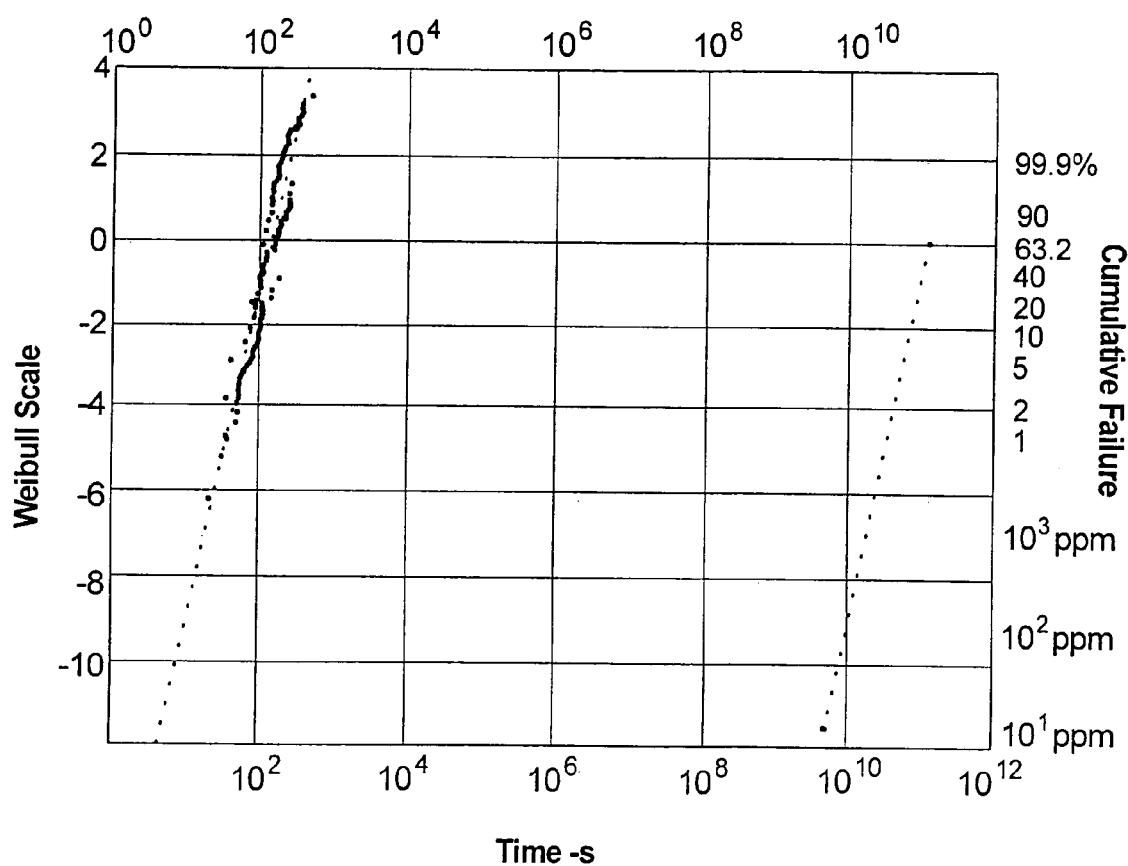
FIG. 9 shows additional, combined test results.

3. Combine Distributions Using Area Scaling:

Equation (4) above can be used to combine data from several test site stresses. For example, for the chart shown in FIG. 8, the hardware was all stressed at −7.4 V but three different areas were used, 0.01, 0.001, and 0.0001 mm2. The data was then combined by using Equation (4), the areas, and translating the largest area and smallest area test sites in terms of the intermediate area test site as shown in FIG. 9.

Any of the curves may be used as the reference. The smallest error for the estimation of time is at 0 on the Weibull scale or 63% on the percent fail scale [see, Ernest Wu, Edward Nowak, Alex Vayshenker, Jonathan McKenna, and David Harmon Rolf-Peter Vollertsen New Global Insight in Ultra-Thin Oxide Reliability Using Accurate Experimental Methodology and Comprehensive Database]. Here, the variation in time is only about a factor of 2×, whereas at about the 5% cdf level, for example, the time variation is close to 10×. The strength of this area scaling technique is that the Weibull slope, after the area scaling, may be determined from each of the three curves where the confidence is the highest. Inspection of FIGS. 8 and 9 will reveal that this is a much more efficient method of increasing the confidence in the value of the Weibull slope than just increasing sample size.

4. Test in Product Mode.

Test each of the structures in the product mode after the parallel-mode stress fails have been recorded and analyzed. During this test there are several possible outcomes: 1) the test structure does not function e.g., in the case of the ring oscillator, the gate on one stage is broken down so that no oscillation occurs, in the case of the DOTS, the output is incorrect, or more generally, the product like-chip ceases to operate in the expected manner, 2) the test structure does operate as designed and expected, but the overall leakage during operation has measurably increased; and 3) the test structure operates and with no measurable increase in current.

As explained in, Jackson, J. C. Robinson, T. Oralkan, O., Dumin, D. J. Brown, G. A., J of Electrochem Soc., Vol., 45, No. 3, March 1998, the test structures with alternating large and small stages/devices would be expected to experience fail on the gates of the small structures/stages where that structure/stage was driven by a large stage.

5. Review the smaller structures (structures 1, 2, and 3) and partition them into super-sections. For example, if ten Structure 1 ring oscillators are combined into one equivalent Structure 2 ring oscillator for the purposes of analysis, then not only could the first fail be plotted as has been done in the discussions above, but the second fail can also be plotted as can be the third through the tenth fail in this case. This result could then be compared to the result for the first parallel mode fail of structure 2, which is the same size as ten Structure 1 ring oscillators.

Figure 10:
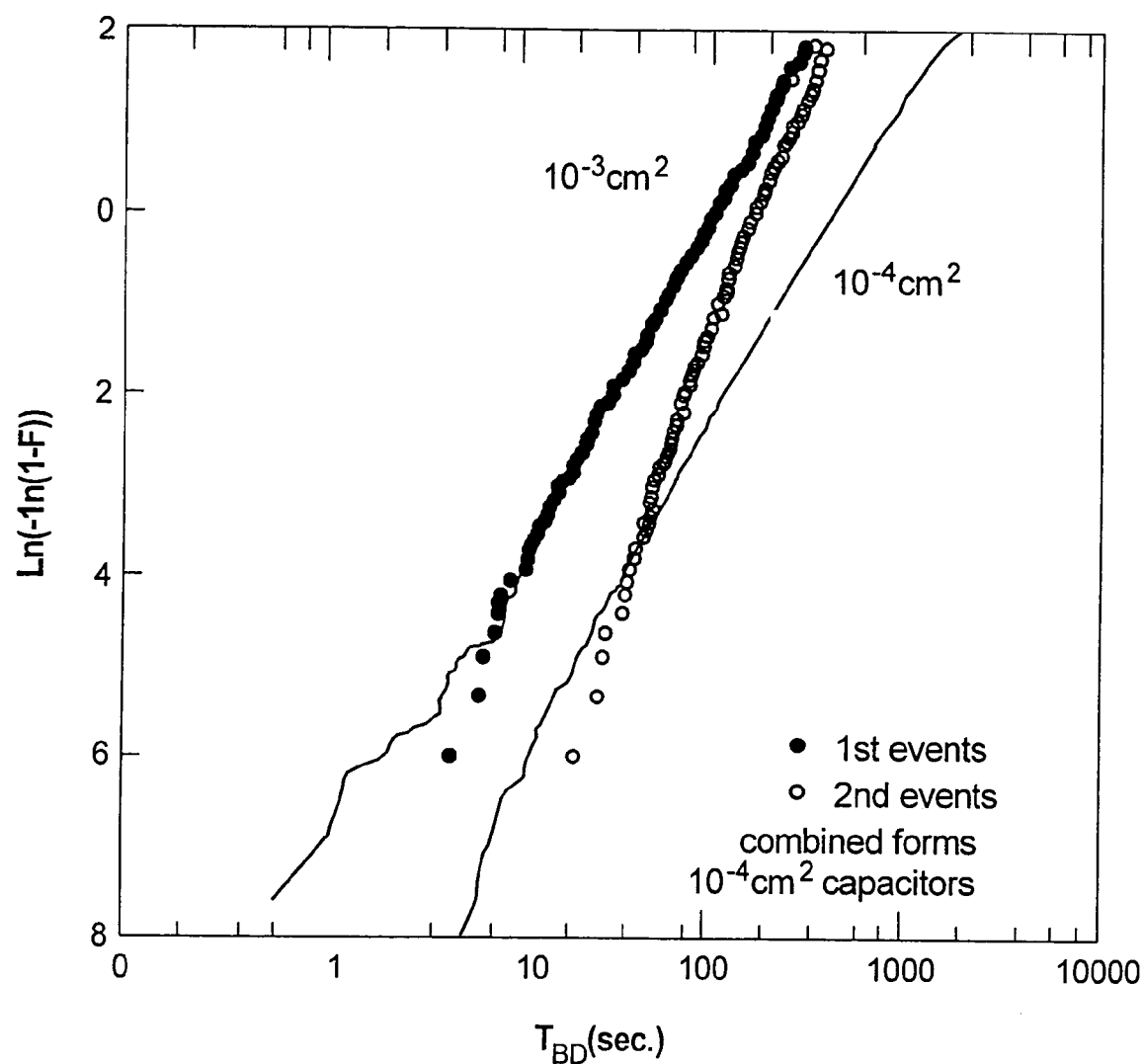
FIG. 10 shows a graph that may be used to predict product reliability.

A typical plot is shown in FIG. 10 where the area difference is 10× and simple capacitors were used as the stress vehicle for this plot. The first parallel mode fail is plotted for the larger structures and the second parallel mode fail is plotted for the combined smaller structure that is equivalent in area to the larger structure. In FIG. 10, the first parallel mode fail is plotted for the larger area 10-3 cm2, and is shown by the solid circles on the right. The solid line in FIG. 10 is the result of the area scaling discussed above. This would be the expected result if one were to plot the first parallel mode fail for the smaller area 10-4 cm2. Clearly, the second parallel mode fail behaves differently than does the first fail. It has a much steeper Weibull slope and as discussed above this would mean that its reliability projection would be much better. What this result means is that if the product does not typically fail for the first parallel mode fail, then the current state of the art analysis procedures are much to pessimistic, regardless of the details of the projection model as per Equations 1-4.

Because the breakdown defects are randomly distributed, the successive breakdown events also follow the same laws of voltage acceleration and temperature activation. This is the advantage of using successive breakdown events for reliability projection. There is no extra stress data required. Also note that the successive breakdown distributions are not Weibull function. They do not follow the usual Poisson area scaling law.

Figure 11:
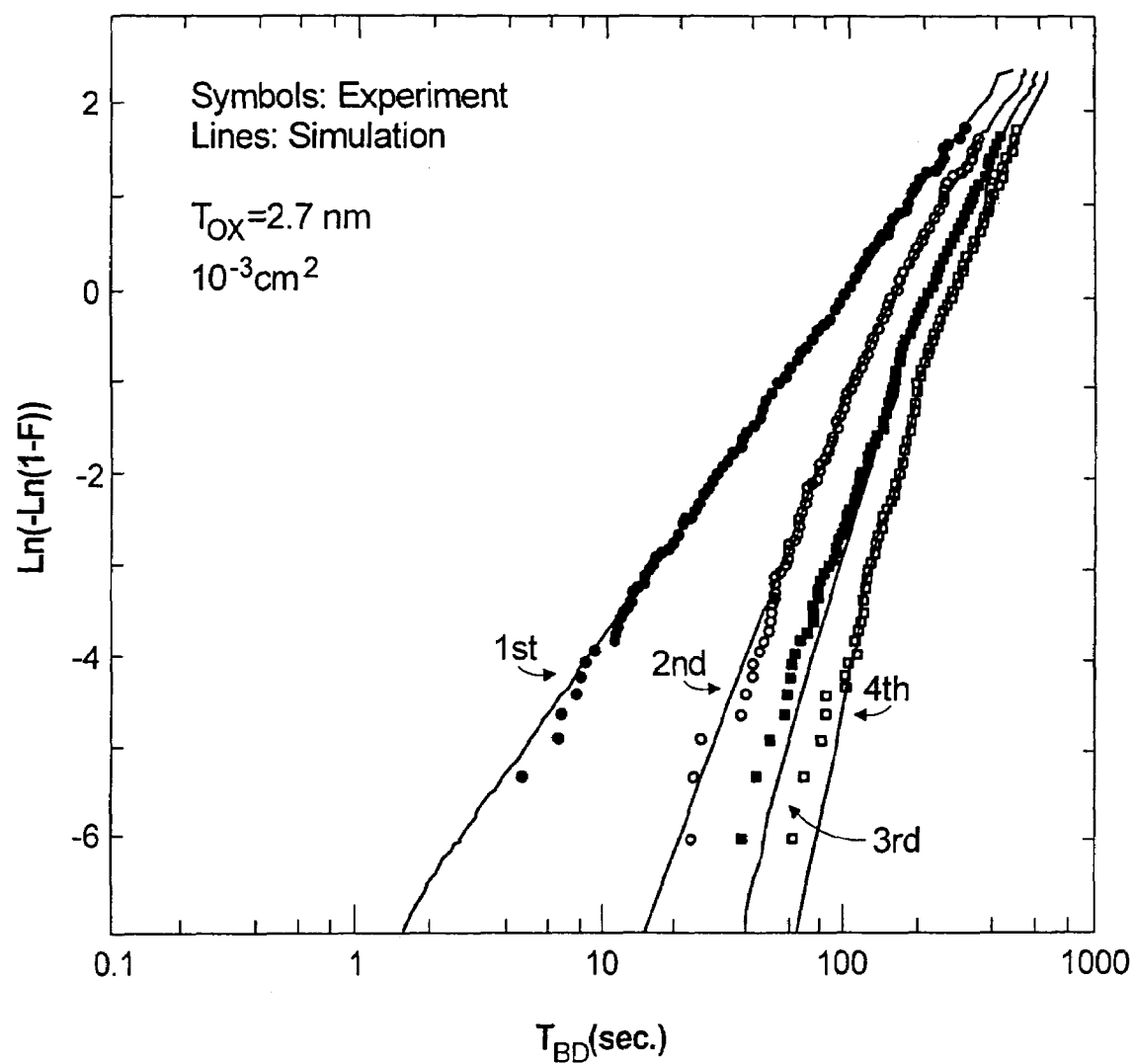
FIG. 11 illustrates experimental results modeled using a Monte Carlo simulator.

This experimental result has also been modeled as shown in FIG. 11 using a Monte Carlo simulation. Here an experimental sample of 4000 parts was used to compare with the Monte Carlo results. The same technique to identify the successive fails. If the product failure rate is significantly longer than the characteristic life predicted by, for example, the first fail, then it would be indicative of that fail not causing the product to fail. The successive breakdown distributions can be used to provide a more realistic and much improved reliability projection.

Figure 12:
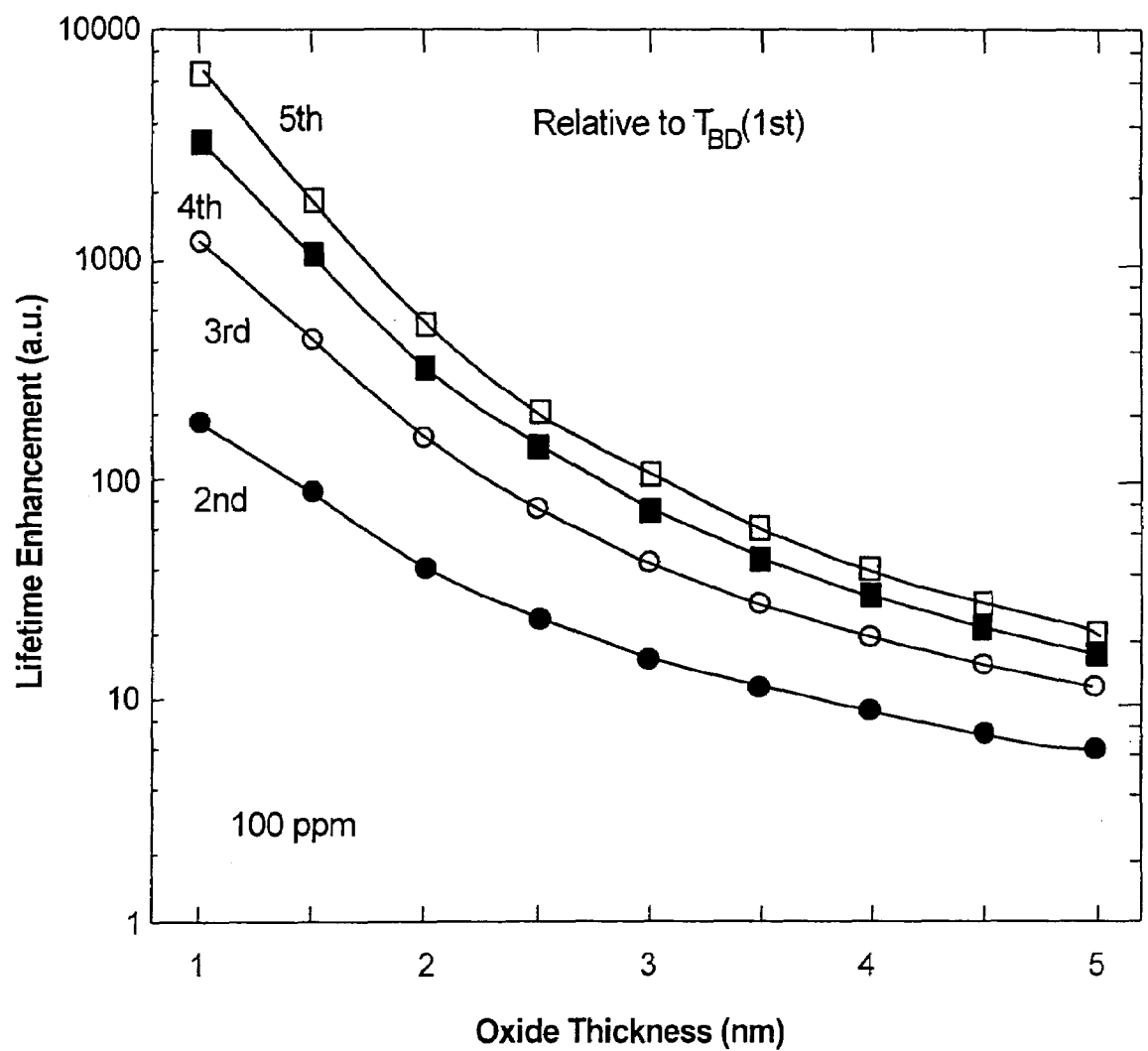
FIG. 12 shows the lifetime enhancement that can be achieved using the present invention.

FIG. 12 shows the lifetime enhancement that can be achieved using this technique. It is potentially possible to extend the life of the dielectric at a given set of conditions by several orders of magnitude when it is known that the first fail or second fail does not cause the product to fail.

6. Determine which parallel mode fail, if not the first, causes the first product mode fail.

For that population that failed the parallel mode test but did not fail the product-mode test, repeat steps two-four to generate a second parallel-mode fail and test for product mode fail. This procedure may be repeated until all of the parallel mode fails cause product mode fails, until the current leakage is high enough in the parallel mode testing as to preclude reliable indication of new fails, or until a relationship between the first parallel mode fail, the second parallel mode fail, or the nth parallel mode fail and the product mode fail is established. This result is likely to be statistical in nature. That is, if the second parallel mode fail is the most likely to cause the product mode fail, a small portion of the time the first parallel mode fail would cause a product mode fail and a small portion of the time the third parallel mode fail would cause the first product mode fail. But in this case the second parallel mode fail would still be the most likely fail to cause the first product mode fail.

7. Based on the subdivision in step five and the results in step six, make projection based on that stress fail which is most likely to cause product fail.

As shown in FIG. 11, not only does the 63.2% fail point move out in time for the nth fail, the slope of the Weibull cum distribution function becomes increasingly steep for each additional fail that can be tolerated by the product without causing product degradation. Again, a steeper slope for the Weibull means a much improved projected reliability performance.

It should be noted that the methodology of the present invention has wide applicability. For example, the invention may be practiced in all varieties of DRAMs, SRAMs and NVRAMs. Even more generally, the invention is applicable to all types of chips that use a common gate or word line configuration.

Figure 13:
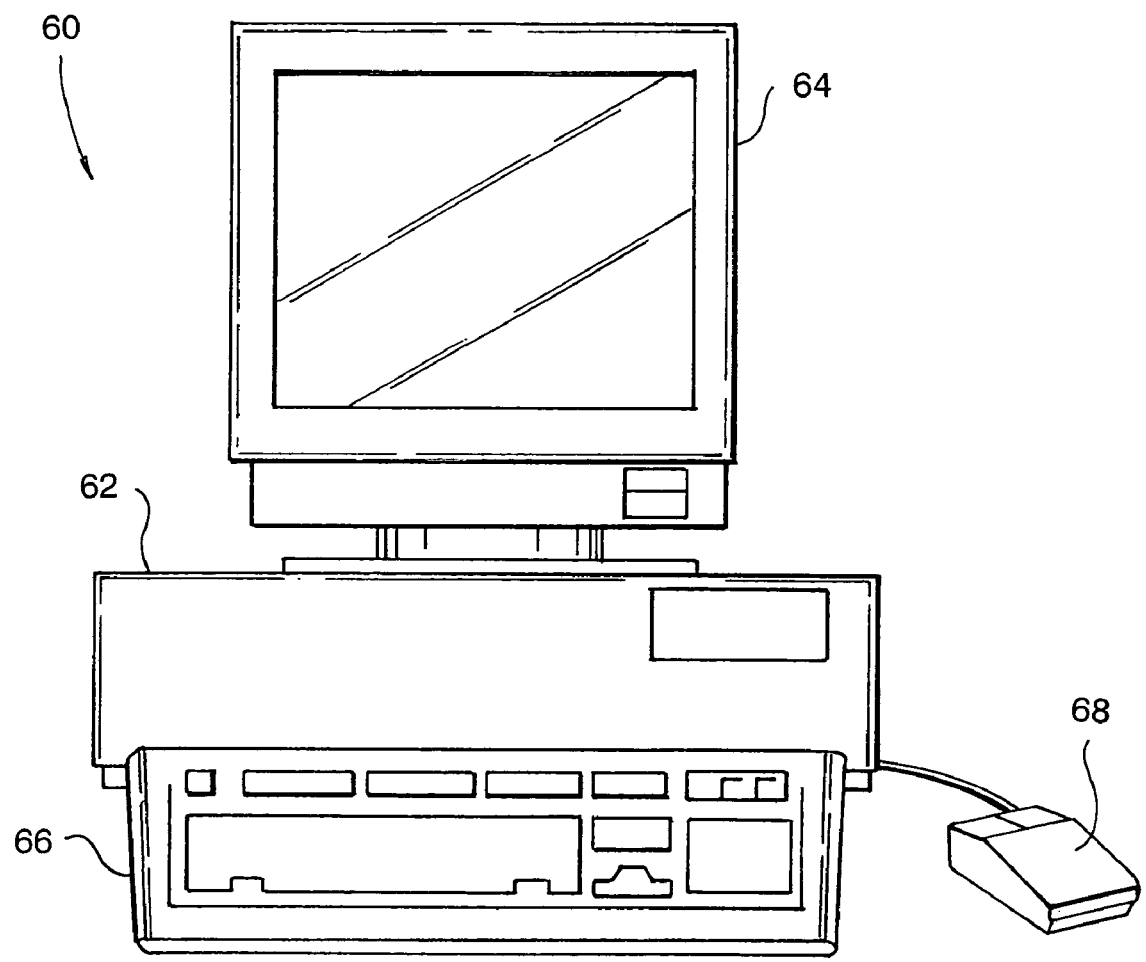
FIG. 13 depicts a computer that may be used to perform calculations used in the practice of this invention.

Any suitable calculator, computer or processor may be used to perform any calculations needed or preferred din the practice of this invention. As an example, FIG. 13 shows computer 60 that may be used for this purpose. Computer 60 may be a standard personal computer, including a central processing unit 62, a monitor 64, a keyboard 66, and a mouse 68 or other pointing devices. A notebook computer, a laptop computer, or a work station could also be used in the present invention.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A system for predicting gate reliability, comprising:
    a set of test structures in an integrated circuit device, the test structures comprising a plurality of gates;
    first means for stressing the test structures in a parallel mode configuration to obtain gate dielectric test site data such that each of the structures is stressed at different conditions until each structure exhibits a hard fail to obtain plural sets of breakdown data based thereon;
    means for analyzing and conducting an operation of collapsing the plural sets of breakdown data into a single set to improve the statistical confidence of the test site data results;
    second means for stressing the test structures in a product mode configuration according to a defined criteria in order to determine how many of the parallel mode hard fails are also product mode hard fails; and
    means for using the test site data to predict gate reliability.

2. A system for predicting gate reliability according to claim 1, wherein the means for analyzing and conducting further includes:
    means for determining which parallel mode hard fail causes the first product mode hard fail; and
    means for making a projection of the product gate reliability based on the stress fail that is most likely to cause product fail.

3. A system for predicting gate reliability according to claim 1, wherein the first means for stressing includes:
    means to apply a voltage to each of said structures in parallel mode to apply the parallel mode tests to the structures; and
    wherein the second means for stressing includes:
    means to apply a voltage to each of said structures in series to apply the product mode test to the structures.

4. A system for predicting gate reliability according to claim 3, wherein the means to apply a voltage to each of said structures in parallel mode tests to the structures includes applying a plurality of different voltages to said gates.

5. A system for predicting gate reliability according to claim 4, wherein the plurality of gates include at least 1001 pairs of gates.

6. A system for predicting gate reliability according to claim 5, wherein the plurality of gates include at least 8009 pairs of gates.

7. A system for predicting gate reliability according to claim 1, wherein the means for collapsing the plural sets of breakdown data includes:
    means for plotting time-to-fail for each parallel mode hard fail for each of a plurality of sets of breakdown data to obtain a plurality of curves, and for collapsing said plurality of curves into one curve by projecting the plurality of sets of breakdown data to a single set of data, to improve the statistical confidence of the results.

* * * * *